(12) United States Patent
Furukawa et al.

(10) Patent No.: US 7,560,347 B2
(45) Date of Patent: Jul. 14, 2009

(54) METHODS FOR FORMING A WRAP-AROUND GATE FIELD EFFECT TRANSISTOR

(75) Inventors: Toshiharu Furukawa, Essex Junction, VT (US); Mark Charles Hakey, Fairfax, VT (US); David Vaclav Horak, Essex Junction, VT (US); Charles William Koburger, III, Delmar, NY (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/114,180

(22) Filed: May 2, 2008

(65) Prior Publication Data

US 2008/0206937 A1 Aug. 28, 2008

Related U.S. Application Data

(60) Continuation of application No. 11/735,075, filed on Apr. 13, 2007, now Pat. No. 7,435,653, which is a division of application No. 10/732,958, filed on Dec. 11, 2003, now Pat. No. 7,271,444.

(51) Int. Cl.
*H01L 21/336* (2006.01)
(52) U.S. Cl. .................. 438/284; 438/177; 438/197
(58) Field of Classification Search .............. 438/177, 438/197, 284
See application file for complete search history.

(56) References Cited

U.S. PATENT DOCUMENTS

| | | | |
|---|---|---|---|
| 5,801,397 A | 9/1998 | Cunningham | |
| 6,413,802 B1 | 7/2002 | Hu et al. | |
| 6,483,156 B1 | 11/2002 | Adkisson et al. | |
| 6,563,131 B1 | 5/2003 | Adkisson et al. | |
| 6,833,588 B2 | 12/2004 | Yu et al. | |
| 7,074,656 B2 | 7/2006 | Yeo et al. | |

FOREIGN PATENT DOCUMENTS

| | | |
|---|---|---|
| JP | 05-048090 A | 2/1993 |
| JP | 05-218421 A | 8/1993 |
| JP | 2003-324200 A | 11/2003 |

*Primary Examiner*—Douglas M Menz
(74) *Attorney, Agent, or Firm*—Wood, Herron & Evans, LLP

(57) ABSTRACT

A field effect transistor is formed having wrap-around, vertically-aligned, dual gate electrodes. Starting with a silicon-on-insulator (SOI) structure having a buried silicon island, a vertical reference edge is defined, by creating a cavity within the SOI structure, and used during two etch-back steps that can be reliably performed. The first etch-back removes a portion of an oxide layer for a first distance over which a gate conductor material is then applied. The second etch-back removes a portion of the gate conductor material for a second distance. The difference between the first and second distances defines the gate length of the eventual device. After stripping away the oxide layers, a vertical gate electrode is revealed that surrounds the buried silicon island on all four side surfaces.

19 Claims, 7 Drawing Sheets

METHODS FOR FORMING A WRAP-AROUND GATE FIELD EFFECT TRANSISTOR

CROSS-REFERENCE TO RELATED APPLICATIONS

This application is a continuation of application Ser. No. 11/735,075, filed Apr. 13, 2007, which is a divisional of application Ser. No. 10/732,958, filed Dec. 11, 2003. The disclosure of each of which is hereby incorporated by reference herein in its entirety.

FIELD OF THE INVENTION

The present invention relates to field-effect transistors and, more particularly, to dual-gated field-effect transistors.

BACKGROUND OF THE INVENTION

A field-effect transistor (FET) is a type of transistor commonly used in Ultra Large Scale Integration (ULSI). In the FET, current flows along a semiconductor path called the channel. At one end of the channel, there is an electrode called the source. At the other end of the channel, there is an electrode called the drain. The physical dimensions of the channel are fixed, but its number of electrical carriers can be varied by the application of a voltage to a control electrode called the gate. The conductivity of the FET depends, at any given instant in time, on the number of electrical carriers of the channel. A small change in gate voltage can cause a large variation in the current from the source to the drain. This is how the FET amplifies signals. In one popular type of FET, known as a MOSFET, the channel can be either N-type or P-type semiconductor. The gate electrode is a piece of metal whose surface is insulated from the channel by an oxide layer between the gate electrode and the channel. Because the oxide layer acts as a dielectric, there is little current between the gate and the channel during any part of the signal cycle. This gives the MOSFET an extremely large input impedance.

As semiconductor devices, such as FETs, have become smaller, a number of techniques have been employed to ensure that performance, speed, and reliability of the devices are not adversely affected. One technique, useful for a number of different devices, includes Silicon-On-Insulator (SOI) structures in which a silicon layer has a buried oxide layer (BOX) between it and a handle wafer. The active elements (e.g., transistors) are fabricated in the silicon layer over the BOX. The BOX is present to provide thick, robust vertical isolation from the substrate thereby resulting in better turn-off characteristics and low capacitance. One method of forming an SOI substrate is to bond two oxidized wafers, then thin one of those wafers so as to form a silicon layer of a thickness appropriate for device fabrication. This structure leaves a thin silicon layer above a layer of oxide.

Another technique, specifically for improving field-effect transistors, involves using dual-gates. In a dual-gated transistor, a top gate and a bottom gate are formed around an active region. Specifically, the advantages for dual gate devices over their single gate counterparts include: a higher transconductance and improved short-channel effects. The improved short-channel effects circumvent problems involving tunneling breakdown, dopant quantization, and dielectric breakdown associated with increasingly high channel doping of shrinking single gate devices. These benefits depend on the top and bottom gates being similar in construction and properly aligned in the vertical direction and aligned with the source/drain regions.

SOI techniques have been used in previous attempts at forming dual-gated devices. In these attempts, the buried oxide layer under a portion of the SOI island is removed, usually by dipping in an etchant, to gain access to the bottom surface of the silicon. Once exposed, a dielectric can be grown on this bottom surface and a gate conductor material deposited. One significant shortcoming of this technique is that the top gate and the bottom gate are not precisely aligned. Accordingly, the advantages of dual-gating are diminished or lost.

One recent attempt to form dual-gated devices that have self-aligned gates is the FinFET. Unlike traditional devices, FinFETs are constructed vertically rather than horizontally and, thus, requires a difficult-to-perform directional etch to determine the device gate length. As gate length is one of the most critical characteristics of a device and its behavior, the fabrication steps that define gate length should be easy to control, very reliable, and easy to duplicate.

Accordingly, there remains a need for a dual-gated device formed horizontally that has self-aligned top and bottom gates. Additionally, there remains a need for a method of forming these gates that simply, accurately, and reliably controls the gate length during fabrication.

SUMMARY OF THE INVENTION

Accordingly, embodiments of the present invention use an SOI structure to form a wrap-around gate electrode for a FET. By wrap-around gate, it is meant that the gate electrode material encircles the periphery, or a majority thereof, of the silicon channel used to form the source and drain regions. In particular, a vertical reference edge is defined, by creating a cavity within the SOI structure, and used during two etch-back steps that can be reliably performed. The first etch-back removes a portion of an oxide layer, for a first distance, over which a gate conductor material is applied. The second etch-back removes a portion of the gate conductor material for a second distance. The difference between the first and second distances defines the gate length of the eventual device. After stripping away the oxide layers, a vertical gate electrode is revealed that surrounds the buried silicon island on all four side surfaces.

One aspect of the present invention relates to a method for forming a wrap-around-gate field-effect transistor, gated on all four active surfaces by a self-aligned electrode, on a handle wafer. In accordance with this aspect, an SOI structure is formed on the handle wafer and then a cavity is formed in this structure extending from its top surface to the handle wafer. Within the cavity, an oxide material is etched back so as to expose the sides of a buried SOI island. With the sides of the SOI island exposed, a gate conductor material can be deposited thereon. This gate conductor material can then, itself, be etched back thereby forming a self-aligned gate electrode that surrounds the SOI island on its four sides.

Another aspect of the present invention relates to a portion of a wrap-around-gated field-effect transistor. This portion includes a handle wafer, an SOI island and a gate electrode. More particularly, the SOI island includes four side surfaces and extends, for its length, in the horizontal direction. The gate electrode surrounds and supports the SOI island. The gate electrode extends in a vertical direction from the handle wafer and has a thickness smaller than the SOI island's length. In other words, the gate electrode includes a first portion below the SOI island, a second portion on one side of the SOI island, a third portion on another side of the SOI island, and a fourth portion above the SOI island such that the gate electrode surrounds the four side surfaces of the SOI island.

Yet another aspect of the present invention relates to a field-effect-transistor that includes a silicon-on-insulator (SOI) island having a top surface, a bottom surface, a right-side surface, a left-side surface, and two edge faces, wherein the SOI island is oriented substantially in a horizontal direction. This transistor also includes a wrap-around gate electrode oriented in substantially a vertical direction intersecting with the SOI island in-between the two edge faces such that the SOI island surrounds the SOI island along a portion of the top surface, the bottom surface, the right-side surface and the left-side surface. Additionally, the transistor includes a source region formed on a first part of the SOI island on one side of the gate electrode; and a drain region formed on a second part of the SOI island on another side of the gate electrode.

DETAILED DESCRIPTION

Figure 1:
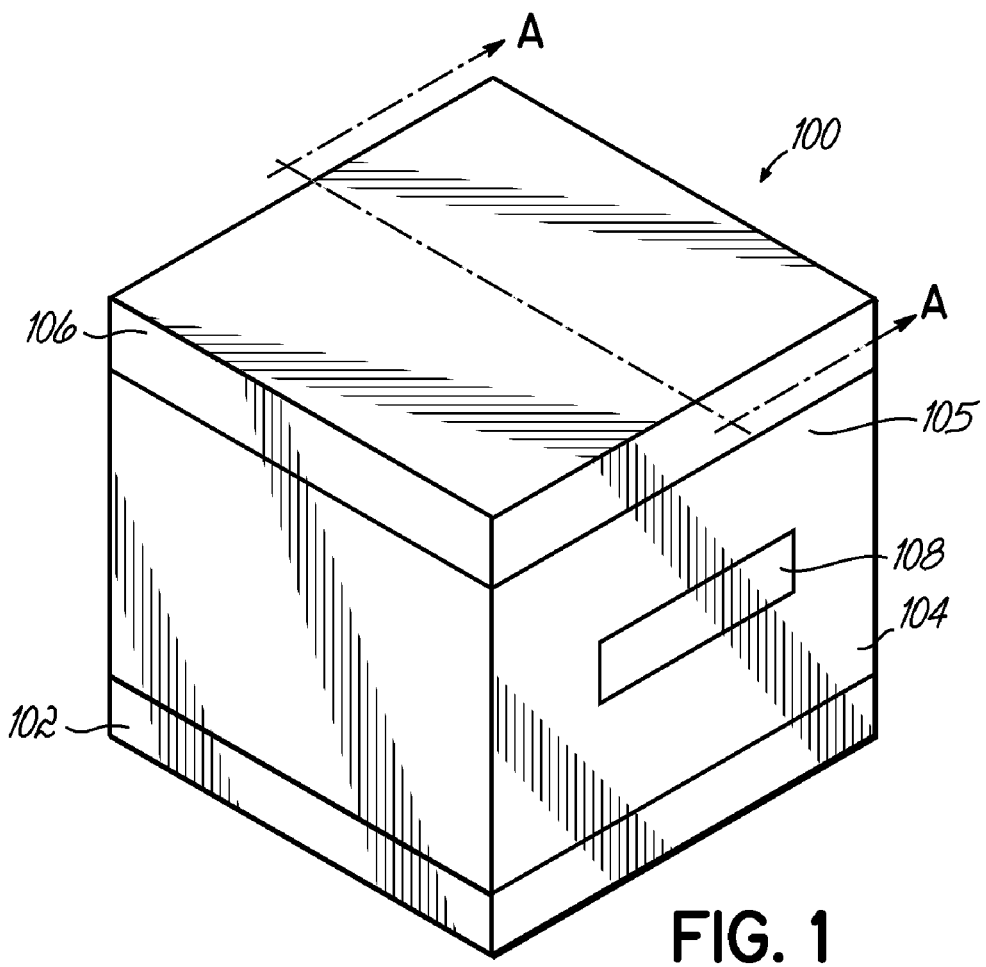
FIG. 1 illustrates a perspective view of a SOI structure having a silicon island surrounded by an oxide.

The structure 100 shown in the perspective view of FIG. 1 is a typical SOI structure formed using conventional patterning and etching techniques. A wide variety of methods of forming the SOI structure 100 can be employed. This SOI structure 100 includes a handle wafer 102 that in many applications can be a non-silicon material such as a nitride and will have a thickness of approximately 200 nm-1 mm. Alternatively, if a silicon handle wafer is employed, it can be capped with a nitride layer (not shown) to prevent interaction of the silicon with other materials.

The central region of the structure 100 is an oxide such as, for example silicon dioxide. This central region includes a buried oxide (BOX) layer 104 and a cap oxide layer 105. Within the oxide layers 104, 105 is a silicon-on-insulator (SOI) island 108. On top of the cap oxide layer 105, a hard mask 106 is formed.

Figure 2:
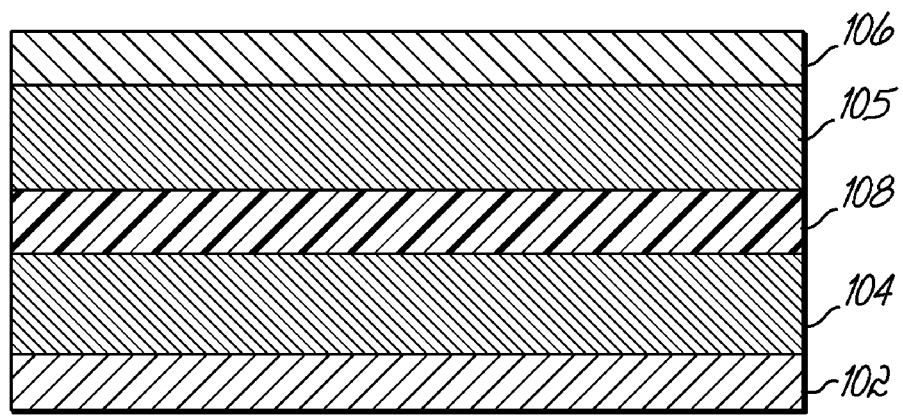
FIG. 2 illustrates a cross-sectional view of the structure of FIG. 1.

FIG. 2 illustrates a cross-sectional view of the exemplary structure 100 taken along the plane A-A depicted in FIG. 1. From this view, it is apparent that in this embodiment the SOI island 108 extends the entire length of the structure 100 and that the oxide layers 104, 105 are approximately as thick above the island 108 as below the island 108. However, these relative dimensions can vary without departing from the scope of the present invention. In practice, the BOX layer 104 is typically between 100 to 1000 nm thick as is the cap oxide layer 105. The SOI island 108 generally ranges between 20 to 250 nm thick.

Figure 3:
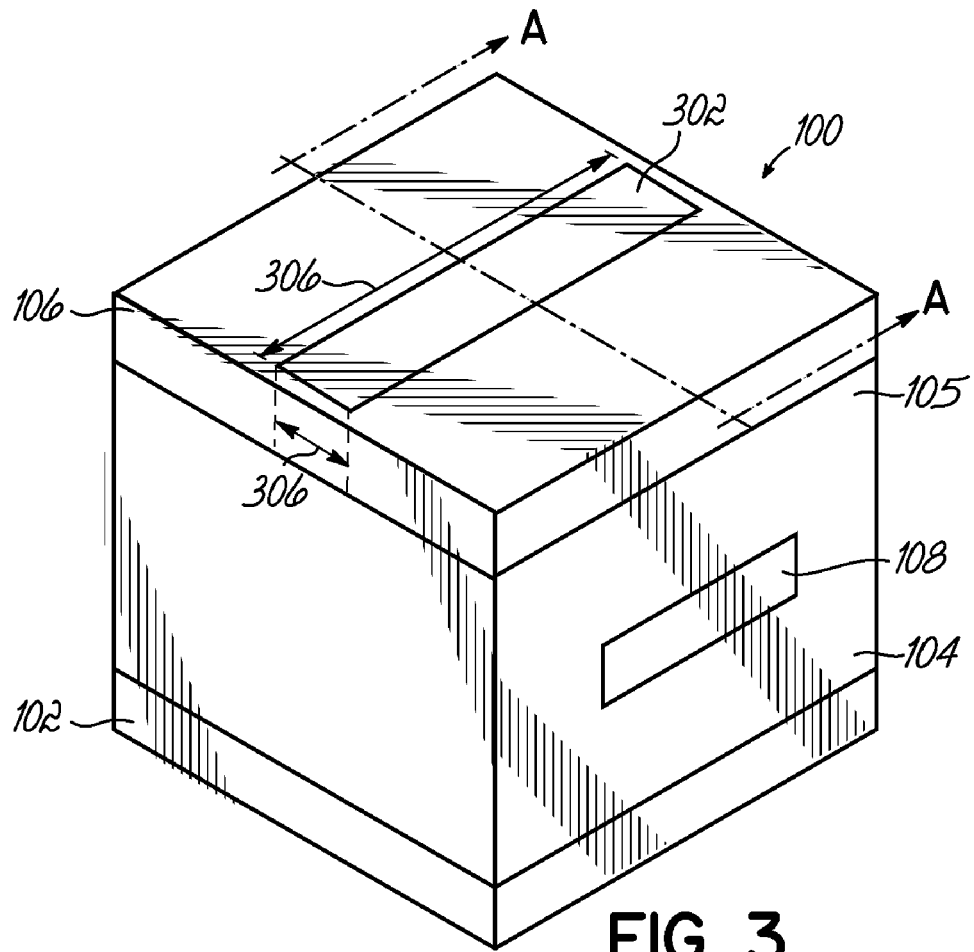
FIG. 3 illustrates the structure of FIG. 1 with an etching boundary defined on its top surface.
Figure 4:
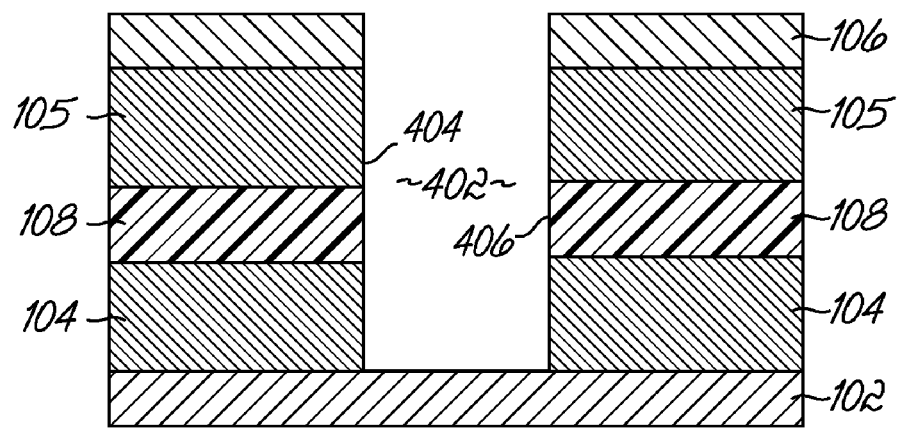
FIG. 4 illustrates a cross section of an SOI structure after a cavity has been formed along its entire thickness.

It is from this structure 100 that the wrap-around-gate of the present invention is formed. A cavity 402 is formed in the structure 100 as shown in FIGS. 3 and 4. In particular, conventional photolithography techniques, such as a photo resist layer, are used to print an etching region 302 on the hard mask 106 to define the boundaries of an etching step. Once the boundaries are defined, the cavity 402 is etched through the hardmask 106, the cap oxide layer 105, the island 108 and the BOX layer 104 below the island 108. After etching, the resist layer is stripped off the hard mask 106. One of ordinary skill would recognize that a variety of etching compounds are available that can remove these layers in one step or in a plurality of steps. Furthermore, the etching can be performed in a timed-manner or simply by relying on selectivity between the various materials to ensure that only portions of the desired layers are removed.

As shown in the cross-sectional view of FIG. 4, the etching step to form the cavity 402 is performed so as to form substantially vertical sidewalls 404, 406. As a result, an SOI island 108 is created on each side of the cavity 402. The width 306 of the etching region 302, and therefore of the cavity 402 as well, is approximately between 50 to 200 nm. The length 304, however, depends on the application. For example, the structure of FIG. 1 only has a single SOI island 108 and the length 304 would typically only need to be enough to overlap each edge of the island 108 by around 20 nm. If however, a plurality of side-by-side SOI islands were formed between oxide layers 104 and 105, then the length 304 would typically need to be enough to overlap the outside islands by around 20 nm. Thus, as SOI islands can vary between 25-2000 nm, the length 304 can vary widely based on the size of the island and the number of buried SOI islands.

The next step in the process is to use the cavity 402 to etch the cap oxide layer 105 and the BOX layer 104. For example, buffered hydrofluoric acid (BHF) can be used to etch the oxide (layers 104, 105) but it will not remove any of the SOI island 108, the hard mask 106, or the handle wafer 102. The etch of the BOX layer 104 is timed or controlled so as to create the cross section profile shown in FIG. 5. Because the etch of the oxide layers 104, 105 occurs in three dimensions, the sides, top and bottom of each SOI island 108 are exposed.

Figure 5:
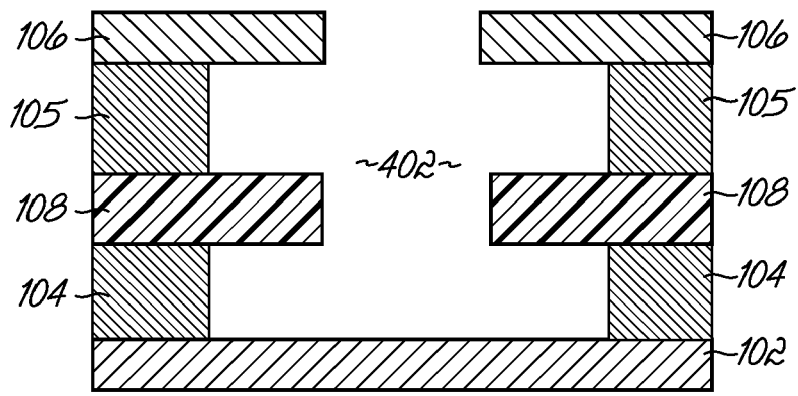
FIG. 5 illustrates the structure of FIG. 4 after the oxide has been etched-back a predetermined distance.
Figure 6:
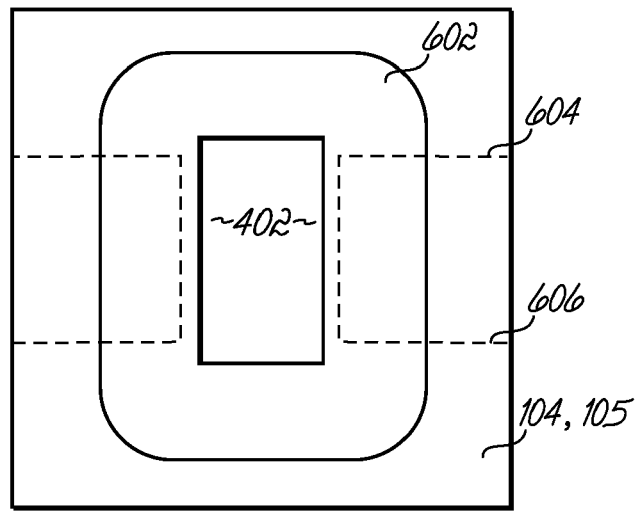
FIG. 6 illustrates a top view of the structure of FIG. 5 showing the outline of the oxide.

FIG. 6 is a top view of the structure 500 of FIG. 5 with some of the visible features omitted. In particular, FIG. 6 highlights the region 602 of the cap oxide layer 105 and the BOX layer 104 after the etching step with BHF is completed. While not shown in FIG. 6 for clarity, the hardmask 106 and island 108 also would extend into the region 602 and be visible from a top view. Dotted lines 604 and 606 depict the outline of the buried island 108.

Figure 7:
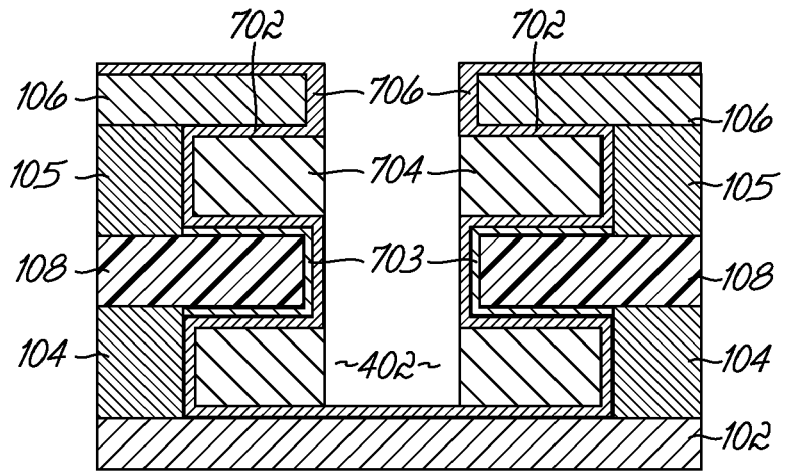
FIG. 7 illustrates a cross-sectional view of an intermediate stage of the structure of FIG. 5 after a gate dielectric, a gate conductor material and fill material have been formed within the cavity.

FIG. 7 illustrates a cross-sectional profile of the SOI structure after completion of a number of intermediate steps. The first step is to form gate dielectric material 703 on all the exposed surfaces of each SOI island 108. Once this gate dielectric 703 is formed, a gate conductor material 702, such as polysilicon, is conformally deposited over the hard mask 106 and within the cavity 402 at a thickness of about 50 nm. This material coats the exposed surfaces of all the layers within the cavity 402. In particular, the conformal gate conductor material 702 coats the top, bottom, face, and sides of the SOI island 108, which are coated with the gate dielectric 703. In one embodiment of the present invention, the gate conductor material 702 substantially fills the cavity 402 and no other material-depositing steps are used.

However, the cross-sectional view of FIG. 7 illustrates an alternative embodiment, in which the gate conductor material 702 does not fill the cavity 402. In this embodiment, a gap-fill material 704, usually an organic material, is used to substantially fill the cavity 402 once the gate conductor material 702 is deposited. Using the hardmask 106 as the guide, directional etching, such as reactive ion etching (RIE), is used to remove some of the gap-fill material 704 within the cavity 402 to create substantially vertical sidewalls. The etching of the gap-fill material 704 is continued until a portion 706 of the gate conductor material 702 on the edge face of each SOI island 108 is exposed within the cavity 402. At this point, the SOI structure 100 is as illustrated in FIG. 7.

Figure 8:
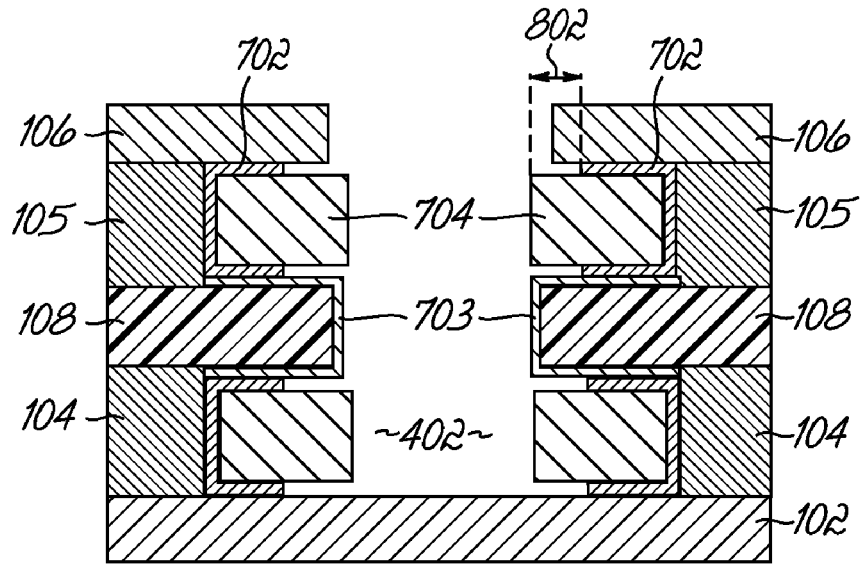
FIG. 8 illustrates the structure of FIG. 7 after the gate conductor material has been etched-back a predetermined distance.

Next, referring to FIG. 8, the gate conductor material 702 is isotropically etched back as shown by region 802. Throughout the cavity 402, all exposed gate conductor material 702 is uniformly etched back. Referring back to FIG. 5, the oxide layers 104, 105 were isotropically etched-back a first distance, such as 100 to 500 nm. Now, the gate conductor material 702 is being etched back a second distance, such as 90 to 400 nm, in region 802. The difference between these two distances is what determines the channel length (i.e., the length of the region between the source and drain, of the resulting transistor) and will be approximately 10 to 120 nm.

Figure 9:
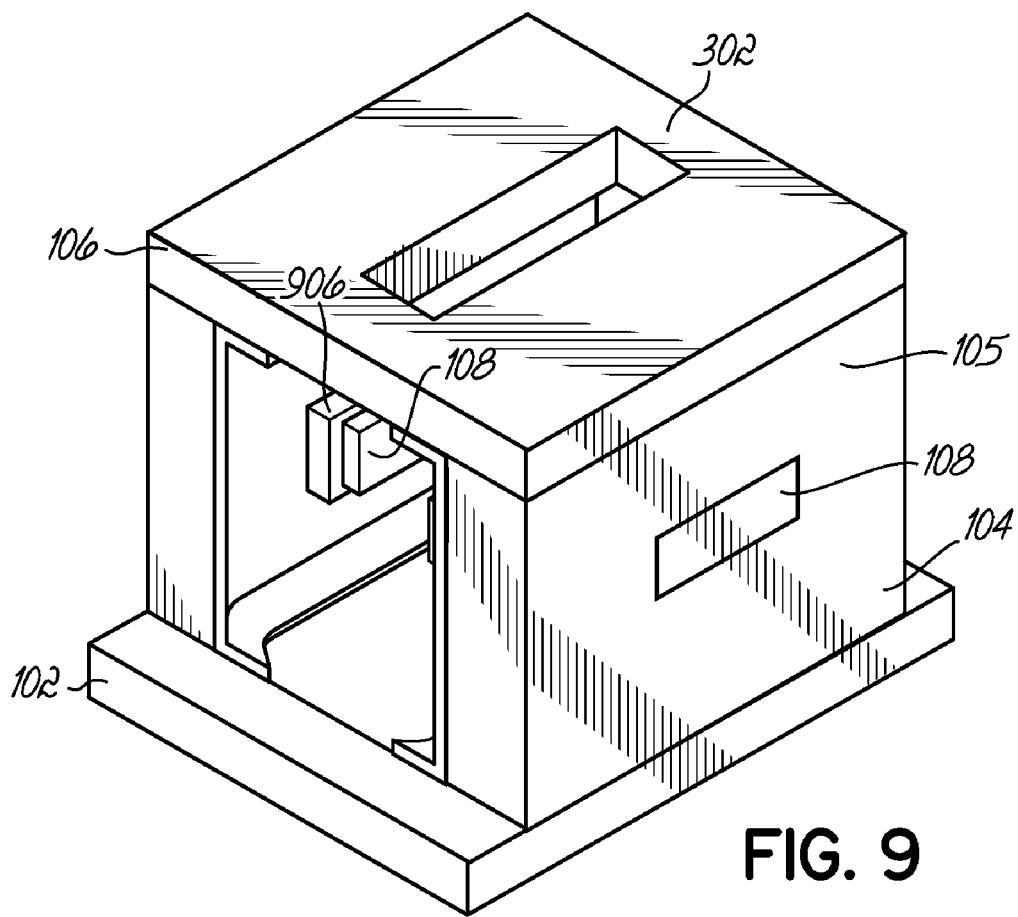
FIGS. 9 and 10 illustrate different views of the structure of FIG. 8 that has been cut into separate devices and had the fill material within the cavity removed.
Figure 10:
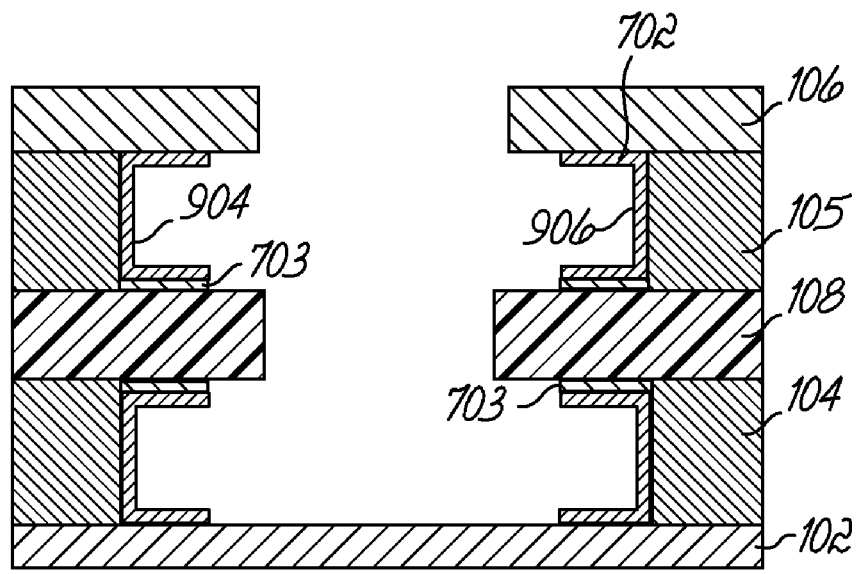

The structure of FIG. 8 is then modified by stripping the organic gap-fill material 704 from within the cavity 402. A perspective view of the resulting structure is depicted in FIG. 9. From FIG. 6 and FIG. 7, it can be determined that the gate conductor material 702 follows the profile of the oxide layers 104, 105 and, therefore, is substantially annular in shape. Thus, the gate conductor material 702 contacts both buried islands 108. To form discrete structures, the sides of the annular gate conductor material can be trimmed, as shown in FIG. 9, so as to create two separate gates 904 and 906. Of particular interest, the gates 904, 905 have a conductor region, such as 902, that wraps around the respective island 108. FIG. 10 shows a cross-sectional profile of the structure of FIG. 9. The C-shaped profile of the gates 904 and 906 is a result of using the gap-fill material 704 in previous fabrication steps. An alternative embodiment is illustrated later that does not use the gap-fill material 704 and has solid portions in place of the C-shaped profiles of gates 904, 906. The gate dielectric 703 can be trimmed back now, as shown in FIG. 10, or etched away at a later stage to expose the surfaces of the SOI island 108.

Figure 11:
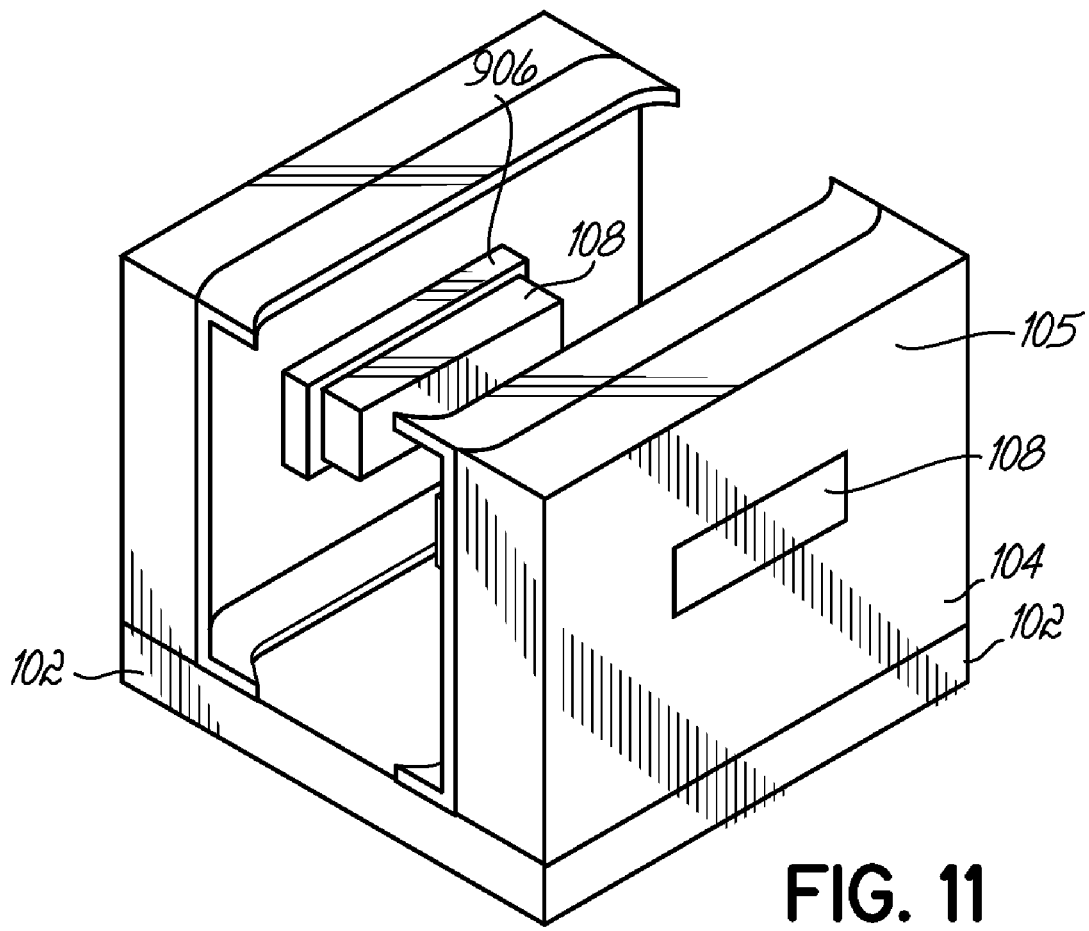
FIGS. 11 and 12 illustrate different views of the structure of FIG. 10 after a hard mask layer has been removed from the top of that structure.
Figure 12:
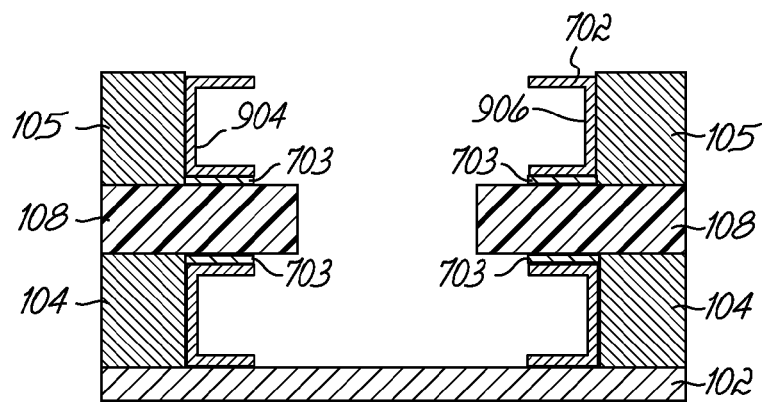
Figure 13:
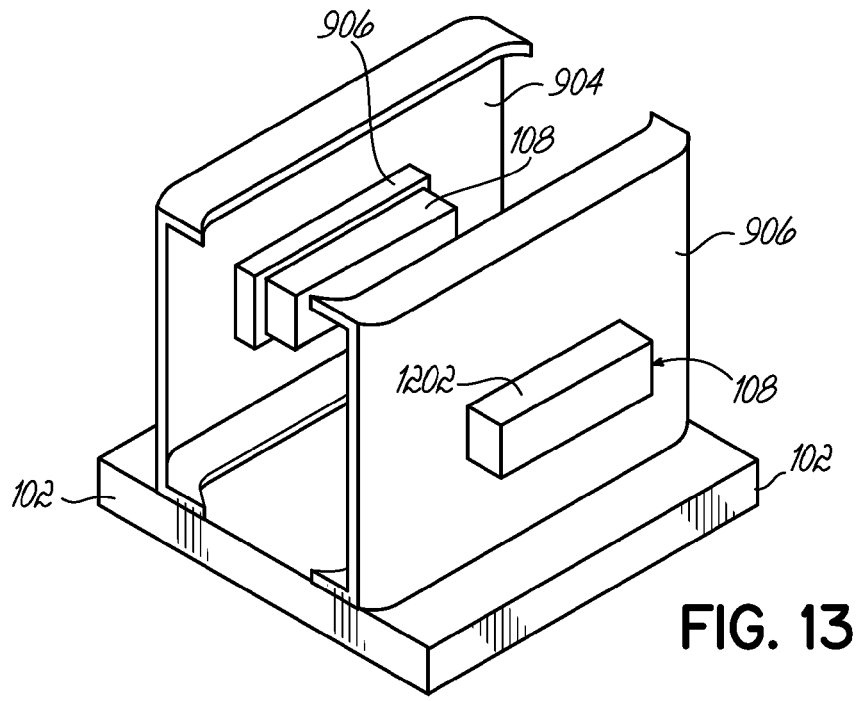
FIGS. 13 and 14 illustrate different views of the structure of FIG. 12 after the oxide layers outside of the gate conductor material has been removed.

After the hardmask 106 has been stripped, the structure is nearing its final form as shown in FIG. 11. FIG. 12 is a cross-sectional profile view of FIG. 11 and shows that one side of each island 108 still has oxide layers 104 and 105 present. Accordingly, it would be difficult to connect a contact, or other material layer, to this section 1202 as depicted in FIG. 12. Accordingly, the oxide layers 104 and 105 can be stripped, as depicted in FIG. 13, to result in two wrap around gates 904 and 906 that each surround a respective portion of the SOI island 108.

Figure 14:
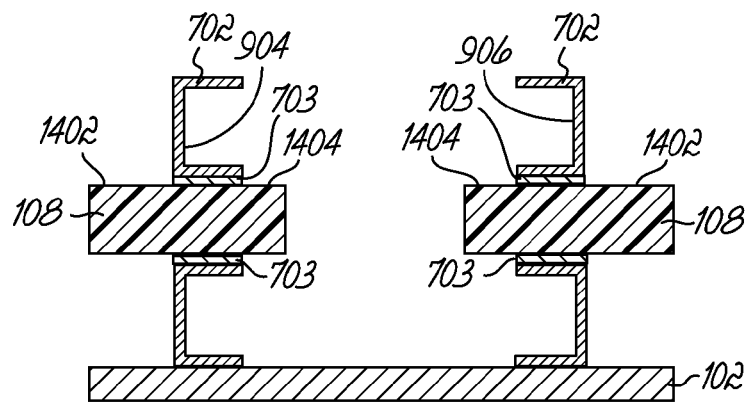

As more clearly seen in the cross-sectional profile of FIG. 14, the top and bottom portions of each gate 904 and 906 are aligned with each other and with the source and drain regions 1402, 1404. The source and drain regions 1402, 1404 are exposed, and contacts to all regions can be easily formed. As understood, by one of ordinary skill, the exposed source/drain regions 1402, 1404 are doped with group 3 or group 5 elements before the contacts are formed. Thus, an SOI device having self-aligned wrap-around gates is formed in such a manner that channel length can be easily controlled using two etch-back steps instead of a difficult long directional etch.

Figure 15A:
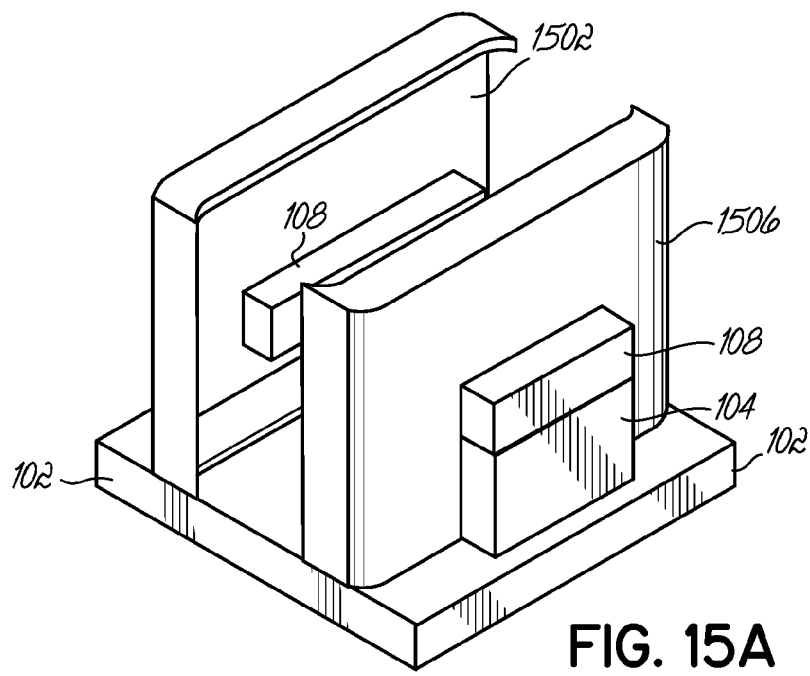
FIGS. 15A and 15B illustrate different views of an alternative structure to that of FIG. 13.
Figure 15B:
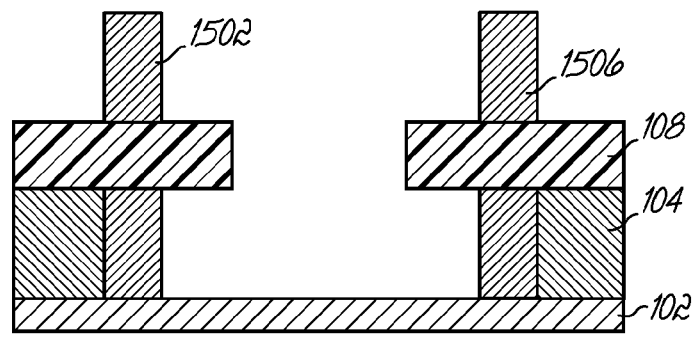

FIGS. 15A and 15B illustrate an alternative embodiment of the device of FIG. 14. In particular, the mechanical strength of the SOI island 108 can be enhanced by stripping away all the BOX material 104 except that under the SOI island 108. A directional etching method, such as RIE, could be used to affect such a result. Even in this embodiment, the top of the SOI island 108 remains exposed to facilitate later processing steps such as passivation or silicidation. A second difference illustrated in FIGS. 15A and 15B involves the gate structures 1502 and 1506.

Referring back to FIG. 7, gate conductor material 702 and gap-fill material 704 were used to fill the cavity 402. However, if only gate conductor material 702 had been used, then the subsequent etching steps would have resulted in the gate structures 1502 and 1506. In particular, these structures 1502 and 1506 do not have the C-shaped profile that is exhibited by the gate structures 904 and 906 of FIG. 10.

Figure 16:
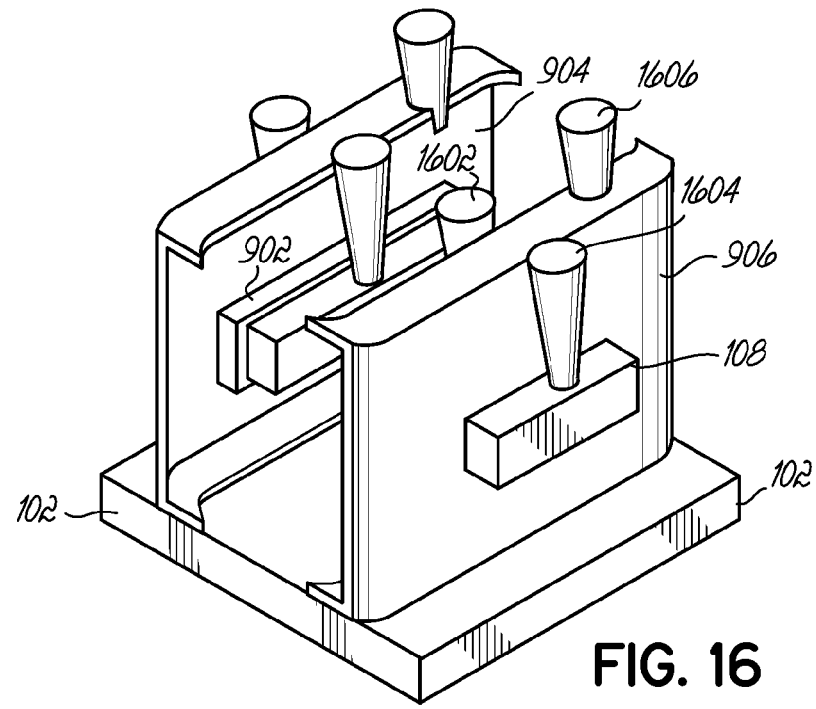
FIG. 16 illustrates the structure of FIG. 13 along with electrodes connected to the gate, source and drain regions.

FIG. 16 illustrates the wrap-around gate structure of FIG. 13 with contact formed on the source/drain regions 1402, 1404 as well as on the gates 904, 906. For example, the contact 1606 provides connectivity with the gate 906; the contact 1602 provides connectivity with one of the source/drain regions 1402, 1404 of the island 108; and contact 1604 provides connectivity with the other of the source/drain regions 1402, 1404 of the island 108.

One of ordinary skill would recognize that there are still further modifications and variations that can be made to the disclosed exemplary embodiments without deviating from the intended scope of the present invention. For example, the exemplary silicon island 108 herein described includes substantially a rectangular cross-sectional profile. In addition to this particular shape, other styles of islands, such as circular, trapezoidal, and polygonal, can be adapted to wrap-around gates as well. Additionally, the wrap-around gate does not have to completely encircle the silicon island as herein described. Performance improvements are still achieved if the wrap-around gate encircles more than a majority around the periphery of the silicon island. By encircling the silicon island by at least that much, the wrap-around gate is able to act as two gate electrodes on opposite sides of the silicon island. Also, the semiconductor island within the SOI structure can include other semiconductor materials in conjunction with, or in replacement of, the exemplary silicon island herein described.

What is claimed is:

1. A method for forming a wrap-around-gate field-effect transistor in a layered structure including a handle wafer, a first oxide layer on the handle wafer, a second oxide layer, and a semiconductor island between the first oxide layer and the second oxide layer, the method comprising: structure including a silicon island between a first oxide layer and a second oxide layer;

forming a vertical cavity in the SOI structure extending from a top surface of the second oxide layer through the second oxide layer, the semiconductor island, and the first oxide layer to the handle wafer;

isotropically etching the first oxide layer and the second oxide layer within the cavity to expose surface portions of the semiconductor island that are aligned generally parallel to the top surface of the second oxide layer and that extend about a circumference of the semiconductor island;

depositing a gate conductor material on the surface portions of the semiconductor island; and isotropically etching the gate conductor material to recess the gate conductor material laterally relative to the surface portions of the semiconductor island to form a wrap-around gate electrode extending entirely around a surface periphery of the silicon island such that a portion of the gate electrode is disposed in a gap between the semiconductor island and the handle wafer.

2. The method of claim 1, further comprising:
forming a gate dielectric on the surface portions of the semiconductor island before the gate conductor material is deposited.

3. A method for forming a wrap-around-gate field-effect transistor in a layered structure including a handle wafer, an oxide material on the handle wafer, and a semiconductor island buried in the oxide material, the method comprising:
forming a first cavity extending vertically from a top surface of the oxide material through the oxide material and the semiconductor island to the handle wafer;

isotropically etching the oxide material within the first cavity laterally relative to the top surface to expose surface portions of the semiconductor island;

depositing a gate conductor material on the surface portions of the semiconductor island; and isotropically etching the gate conductor material to recess the gate conductor material laterally relative to the surface portions of the semiconductor island to form a wrap-around gate electrode extending entirely around a surface periphery of the semiconductor island such that a portion of the gate electrode is disposed in a gap between the SOT island and the handle wafer.

4. The method of claim 3, further comprising:
forming a gate dielectric on the surface portions of the semiconductor island.

5. The method of claim 3, further comprising:
forming an silicon-on-insulator (SOI) structure on the handle wafer.

6. The method of claim 3, wherein the first cavity includes substantially vertical sidewalls.

7. The method of claim 6, wherein the first cavity extends from a top surface of the SOI structure to the handle wafer.

8. The method of claim 3, wherein the oxide material comprises a first oxide layer on the handle wafer below the semiconductor island and a second oxide layer above the semiconductor island.

9. The method of claim 8, further comprising:
forming a hard mask on the second oxide layer, the hard mask including an aperture defining the first cavity.

10. The method of claim 9, wherein the first and second oxide layers are etched anisotropically using the aperture in the hard mask.

11. The method of claim 10, further comprising:
removing the hard mask after the first and second oxide layers are etched.

12. The method of claim 9, wherein depositing the gate conductor material further comprises:
forming a gate dielectric material on the surface portions;
depositing a conformal gate conductor material layer within the first cavity to cover exposed portions of the first and second oxide layers and the semiconductor island; and
depositing an organic fill material to fill the first cavity.

13. The method of claim 12, further comprising:
after depositing the organic fill material, directionally etching a second cavity based on the aperture in the hard mask until at least a portion of the gate conductor material is exposed within the second cavity.

14. The method of claim 13, wherein the second cavity includes substantially vertical sidewalls.

15. The method of claim 13, further comprising:
stripping the organic fill material from the second cavity.

16. The method of claim 3, wherein the semiconductor island extends relative to the top surface of the oxide material between first and second end portions, and further comprising:
removing the oxide material to expose the first and second end portions of the semiconductor island:
forming source/drain regions respectively in the first and second portions of the semiconductor island; and
forming a first contact connected to the gate conductor material and a second contact connected to one of the source/drain regions.

17. The method of claim 3, further comprising:
controlling a gate length of the wrap-around-gate field-effect transistor laterally relative to the top surface of the oxide material by controlling the etching of the oxide material and the gate conductor material.

18. The method of claim 17, wherein controlling the gate length further comprises:
anisotropically etching the oxide material a first distance from a vertical edge of the first cavity; and
isotropically etching the gate conductor material a second distance from the vertical edge of the first cavity, the second distance being less than the first distance so that the gate conductor material is laterally recessed relative to the vertical edge of the first cavity.

19. The method of claim 18 wherein the gate length is substantially equal to a difference between the first distance and the second distance.

* * * * *